(12) United States Patent
Pai et al.

(10) Patent No.: US 12,550,671 B2
(45) Date of Patent: Feb. 10, 2026

(54) PIXELATED CHUCK FOR RETAINING WARPED SEMICONDUCTOR WAFERS

(71) Applicant: INTERNATIONAL BUSINESS MACHINES CORPORATION, Armonk, NY (US)

(72) Inventors: Vinay Pai, Voorheesville, NY (US); Nikhil Jain, Apple Valley, MN (US); Alex Richard Hubbard, Rensselaer, NY (US); Cody J. Murray, Burnt Hills, NY (US); Richard C. Johnson, Selkirk, NY (US)

(73) Assignee: International Business Machines Corporation, Armonk, NY (US)

( * ) Notice: Subject to any disclaimer, the term of this patent is extended or adjusted under 35 U.S.C. 154(b) by 688 days.

(21) Appl. No.: 17/932,050

(22) Filed: Sep. 14, 2022

(65) Prior Publication Data

US 2024/0087939 A1    Mar. 14, 2024

(51) Int. Cl.
*H01L 21/683* (2006.01)
*H01L 21/67* (2006.01)

(52) U.S. Cl.
CPC .... *H01L 21/6833* (2013.01); *H01L 21/67092* (2013.01); *H01L 21/67288* (2013.01); *H01L 21/6838* (2013.01)

(58) Field of Classification Search
CPC ........... H01L 21/6833; H01L 21/67092; H01L 21/67288; H01L 21/6838; H01L 21/6831; H01L 21/6875
See application file for complete search history.

(56) References Cited

U.S. PATENT DOCUMENTS

| | | |
|---|---|---|
| 6,921,724 B2 | 7/2005 | Kamp |
| 7,957,118 B2 | 6/2011 | Chang |
| 8,033,815 B2 | 10/2011 | Babbs |
| 8,477,472 B2 | 7/2013 | Hansen |
| 8,929,051 B2 | 1/2015 | Shu |
| 9,196,514 B2 | 11/2015 | Parkhe |
| 9,892,954 B2 | 2/2018 | Cheng |
| 10,049,901 B2 | 8/2018 | Liu |
| 10,790,180 B2 | 9/2020 | Hsu |
| 10,811,265 B2 | 10/2020 | Devilliers |
| 11,199,562 B2 | 12/2021 | Li |
| 2013/0100572 A1* | 4/2013 | Shu ................... H01L 21/67288 361/234 |

FOREIGN PATENT DOCUMENTS

WO    2016090318 A1    6/2016

* cited by examiner

*Primary Examiner* — Ermias T Woldegeorgis
(74) *Attorney, Agent, or Firm* — Stosch Sabo

(57) ABSTRACT

Described is a semiconductor processing system including a measurement tool configured to measure warpage characteristics in a semiconductor wafer. The semiconductor processing system further includes a pixelated surface configured to retain the semiconductor wafer, where the pixelated surface approximates the warpage characteristics to conform to the semiconductor wafer. The semiconductor processing system further includes a semiconductor processing tool configured to perform processing on the semiconductor wafer while it is retained on the pixelated surface.

19 Claims, 7 Drawing Sheets

PIXELATED CHUCK FOR RETAINING WARPED SEMICONDUCTOR WAFERS

BACKGROUND

The present disclosure relates to semiconductor fabrication, and, more specifically, to fixturing warped semiconductor wafers.

Semiconductor fabrication involves performing different processes (e.g., masking, etching, sputtering, curing, removing, filling, cleaning, etc.) on semiconductor wafers. During such semiconductor processing, the semiconductor wafer can be retained using a fixture (e.g., a chuck) in order to keep the semiconductor wafer stable during processing.

SUMMARY

Aspects of the present disclosure are directed toward a pixelated chuck. The pixelated chuck comprises a plurality of sections forming a surface for retaining a semiconductor wafer. The pixelated chuck further comprises a plurality of actuators respectively associated with the plurality of section. The pixelated chuck further comprises a computer-readable storage medium storing warpage characteristics associated with the semiconductor wafer and executable instructions for transforming the warpage characteristics into a set of activations of the plurality of actuators to cause the plurality of sections to adjust the surface to conform to the semiconductor wafer.

Additional aspects of the present disclosure are directed toward a semiconductor processing system. The semiconductor processing system comprises a measurement tool configured to measure warpage characteristics in a semiconductor wafer. The semiconductor processing system further comprises a pixelated surface configured to retain the semiconductor wafer, where the pixelated surface approximates the warpage characteristics to conform to the semiconductor wafer. The semiconductor processing system further comprises a semiconductor processing tool configured to perform processing on the semiconductor wafer while it is retained on the pixelated surface.

Additional aspects of the present disclosure are directed toward a computer-implemented method. The computer-implemented method comprises measuring warpage characteristics of a semiconductor wafer. The method further comprises transmitting the warpage characteristics to a pixelated chuck. The method further comprises actuating the pixelated chuck to approximate the warpage characteristics. The method further comprises retaining the semiconductor wafer in the pixelated chuck. The method further comprises performing processing on the semiconductor wafer retained in the pixelated chuck.

Additional aspects of the present disclosure are directed to systems and computer program products configured to perform the method described above. The present summary is not intended to illustrate each aspect of, every implementation of, and/or every embodiment of the present disclosure.

BRIEF DESCRIPTION OF THE DRAWINGS

The drawings included in the present application are incorporated into and form part of the specification. They illustrate embodiments of the present disclosure and, along with the description, serve to explain the principles of the disclosure. The drawings are only illustrative of certain embodiments and do not limit the disclosure.

Figure 1:
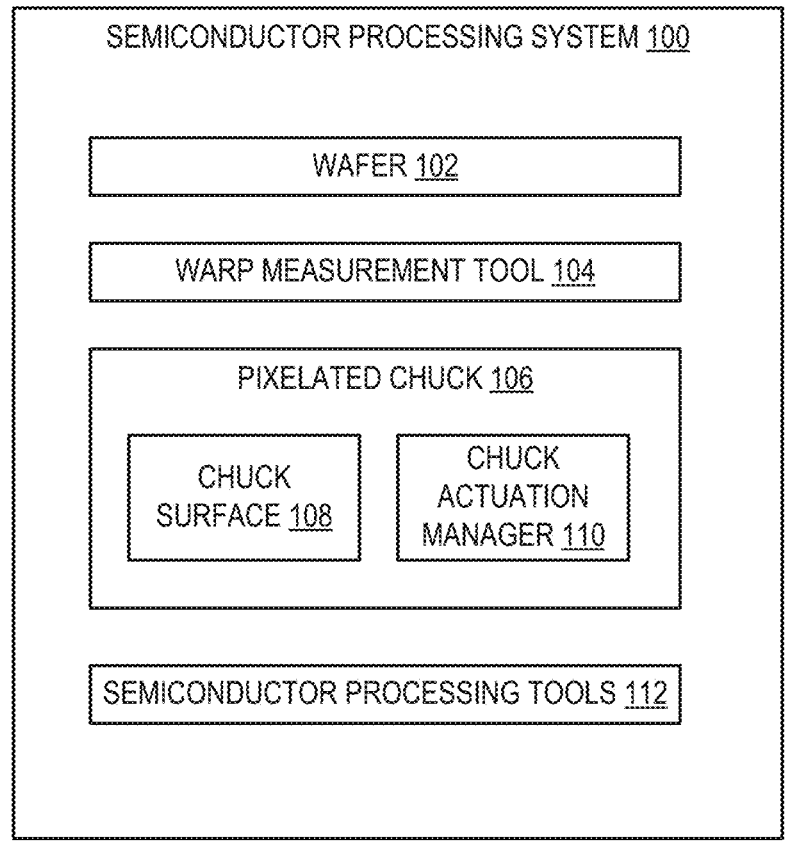
FIG. 1 illustrates a block diagram of an example semiconductor processing system, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure are directed toward semiconductor fabrication, and, more specifically, to fixturing warped semiconductor wafers. While not limited to such applications, embodiments of the present disclosure may be better understood in light of the aforementioned context.

During the semiconductor fabrication process, wafers can become warped. Warpage can refer to symmetric or asymmetric bending, twisting, distortion, or other deformation of a flat surface of a semiconductor wafer. Warpage is sometimes referred to as bowing. Wafers rarely warp in the same way due to variations between batches of materials, processing parameters, ambient (e.g., storage) temperature and/or humidity, and/or other factors.

Any number of wafer features and/or factors can contribute to warpage, including, but not limited to, the materials used, the coefficients of thermal expansion (CTE) and/or coefficients of moisture expansion (CME) of each material used, differences in CTEs and/or CMEs between adjacent materials, the amount of each material used, the location of each material used, the geometry of the wafer, the temperatures and/or temperature changes that occur during the processing, the humidity and/or humidity changes that occur during processing, and/or other factors. Thus, while an ideal semiconductor wafer has a flat, planar bottom surface, in many instances, semiconductor wafers experience warpage as a result of fabrication.

Wafer fixturing mechanisms can use vacuum pressure and/or electrostatic forces to retain a flat surface of the wafer on a flat surface of the fixture. However, such fixturing mechanisms utilize a planar surface and therefore require a matching planar surface to securely retain a wafer. Wafers exhibiting warpage above a threshold cannot be securely retained by existing semiconductor fixturing methods and are therefore scrapped. Scrapped wafers, especially in the latter stages of fabrication, are expensive and inefficient. Furthermore, such wafers with warpage above the threshold for the fixturing mechanism can nonetheless still be utilized in a product. In other words, the fabrication of wafers is more sensitive to warpage than end products utilizing the wafers.

Aspects of the present disclosure are directed toward a fixturing mechanism usable with warped wafers, thereby reducing wafer scrap rate and improving manufacturing efficiency. Aspects of the present disclosure contemplate a pixelated chuck having a plurality of sections forming a surface for retaining a warped semiconductor wafer for processing. The plurality of sections can comprise a pattern of rods, cylinders, cones, a concentric geometry, and/or another geometry useful for conforming to symmetric or asymmetric warpage in the semiconductor wafer. Each of the plurality of sections is independently movable by a corresponding actuator of a plurality of actuators. The plurality of actuators can be actuated to move the plurality of sections to form a surface that conforms to a warpage of the warped semiconductor wafer, where the warpage of the semiconductor wafer can be measured by any measurement tool for characterizing warpage, now known or later developed. The warped semiconductor wafer can then be retained in the conformed surface using, for example, vacuum pressure and/or electrostatic forces transmitted through the plurality of sections. Processing can then be performed on the warped semiconductor wafer retained in the conformed surface.

The aforementioned aspects of the present disclosure can realize numerous advantages. As a first advantage, scrap rate is reduced insofar as the warped semiconductor wafer is successfully processed. In this sense, aspects of the present disclosure realize manufacturing efficiencies (e.g., higher throughput, lower scrap rate, etc.). As a second advantage, the warped semiconductor wafer is successfully processed using the pixelated chuck rather than other manual, time-consuming, and/or expensive techniques (e.g., applying backside dielectric films to attempt to counteract internal stresses in each warped semiconductor wafer). In this sense, the pixelated chuck also realizes manufacturing efficiencies (e.g., reduced manufacturing time, reduced cost and labor associated with backside dielectric films, etc.). As a third advantage, the pixelated chuck is capable of conforming to the unique warpage pattern of each warped semiconductor wafer. Thus, the performance of the pixelated chuck does not rely on a single, standard warpage (which does not exist). As a fourth advantage, the pixelated chuck does not strictly rely on flattening the warped wafer to successfully perform processing on the warped semiconductor wafer. For example, some warped semiconductor processing strategies simply apply mechanical pressure to attempt to force a warped wafer to become flat. However, these strategies often lead to cracked, broken, crushed, and/or otherwise compromised semiconductor wafers. In contrast, the present disclosure successfully processes a warped semiconductor wafer in its warped state, thereby reducing scrap rates associated with attempts to mechanically flatten warped semiconductor wafers.

In some embodiments, the pixelated chuck is configured to receive updated warpage characteristics during processing of the warped semiconductor wafer, and the pixelated chuck can actuate the plurality of actuators to adjust the sections to cause the pixelated chuck surface to conform to the updated warpage characteristics. Such embodiments can be advantageous where changes in temperature and/or humidity during the processing (or the processing itself) cause changes to the warpage of the warped semiconductor wafer.

In some embodiments, the pixelated chuck is configured to incrementally actuate the plurality of actuators to reduce an amount of warpage in the warped semiconductor wafer before, during, and/or after processing of the warped semiconductor wafer. Such embodiments can be advantageous by enabling a warped semiconductor wafer to be flattened more evenly (e.g., using the conformed surface of the pixelated chuck) as opposed to traditional mechanical flattening which can create localized stresses on unsupported warped features which then fail (e.g., crack, break, crush, etc.). Thus, aspects of the present disclosure utilize a pixelated chuck to reduce wafer scrap rate and improve manufacturing efficiency of warped wafers.

Referring now to the figures, FIG. 1 illustrates a block diagram of an example semiconductor processing system 100, in accordance with some embodiments of the present disclosure. Semiconductor processing system 100 can perform processing (e.g., etching, masking, sputtering, curing, removing, filling, cleaning, etc.) on semiconductor wafers at various stages of fabrication. Semiconductor processing system 100 can include a wafer 102, a warp measurement tool 104, a pixelated chuck 106, and semiconductor processing tools 112. Wafer 102 can be a warped semiconductor wafer that is at any stage of fabrication. However, in some situations, wafer 102 is at a relatively advanced or later stage of fabrication, where the previous fabrication steps caused or exacerbated warpage, and where scrapped wafers are especially costly (in terms of material and/or labor that have already been dedicated to them).

Warp measurement tool 104 is any tool, now known or later developed, that is capable of measuring and/or characterizing warpage in wafer 102. Warp measurement tool 104 can utilize lasers and/or images for measuring and/or characterizing warpage in wafer 102. Warp measurement tool 104 can include computational resources for storing warpage characteristics of the wafer 102 and networking resources for transmitting the warpage characteristics of the wafer 102 to the pixelated chuck 106. In some embodiments, warp measurement tool 104 measures and/or characterizes warpage of the wafer 102 once (e.g., upon receiving the wafer 102), whereas in other embodiments, the warp measurement tool 104 measures warpage of the wafer 102 intermittently, semi-continuously, or at another subsequent interval. In embodiments where the warp measurement tool 104 collects multiple measurements of warpage in wafer 102, updated warpage characteristics can be provided to the pixelated chuck 106 before, during, and/or after processing of the wafer 102 to enable the pixelated chuck 106 conform to changing warpage characteristics of the wafer 102 and/or reduce warpage of the wafer 102.

Pixelated chuck 106 is a semiconductor processing fixture for retaining the wafer 102 during processing of the wafer 102. Pixelated chuck 106 includes a chuck surface 108 that conforms to a warpage of the wafer 102, thereby enabling the wafer 102 to be successfully processed despite its warpage and without requiring mechanical flattening. Chuck surface 108 includes a plurality of independently movable sections, where each section is controlled by an attached actuator capable of raising or lowering the associated section. In other embodiments, multiple sections can be controlled by one actuator, or multiple actuators can control a single section. In this way, the plurality of sections can be independently actuated to create a three-dimensional surface conforming to the warpage of the wafer 102.

Pixelated chuck 106 further includes a chuck actuation manager 110. Chuck actuation manager 110 can be a computer-readable storage medium storing (i) warpage characteristics received from warp measurement tool 104 and (ii) executable program code for converting the warpage characteristics to a set of activations of the plurality of actuators to cause the plurality of actuators to actuate their associated sections to replicate a warpage of the wafer 102. The chuck actuation manager 110 can further include computational resources for executing the program code and/or networking resources for receiving the warpage characteristics (e.g., from warp measurement tool 104). In some embodiments, the chuck actuation manager 110 receives updated warpage characteristics from the warp measurement tool 104 and generates updated sets of activations of the plurality of actuators to cause the plurality of actuators to actuate their associated sections to replicate an updated warpage of the wafer 102. In other embodiments, the chuck actuation manager 110 includes executable program code for incrementally reducing an amount of warpage in the wafer 102, where the incremental reductions are initiated from a surface conforming to the warpage of the wafer 102 which causes relatively lower localized stresses (and associated failures) than can occur by mechanical flattening techniques.

Semiconductor processing system 100 further includes semiconductor processing tools 112. Semiconductor processing tools 112 can include tools for etching, masking, curing, depositing, removing, cleaning, sputtering, and/or any other semiconductor fabrication techniques, now known or later developed.

Figure 2A:
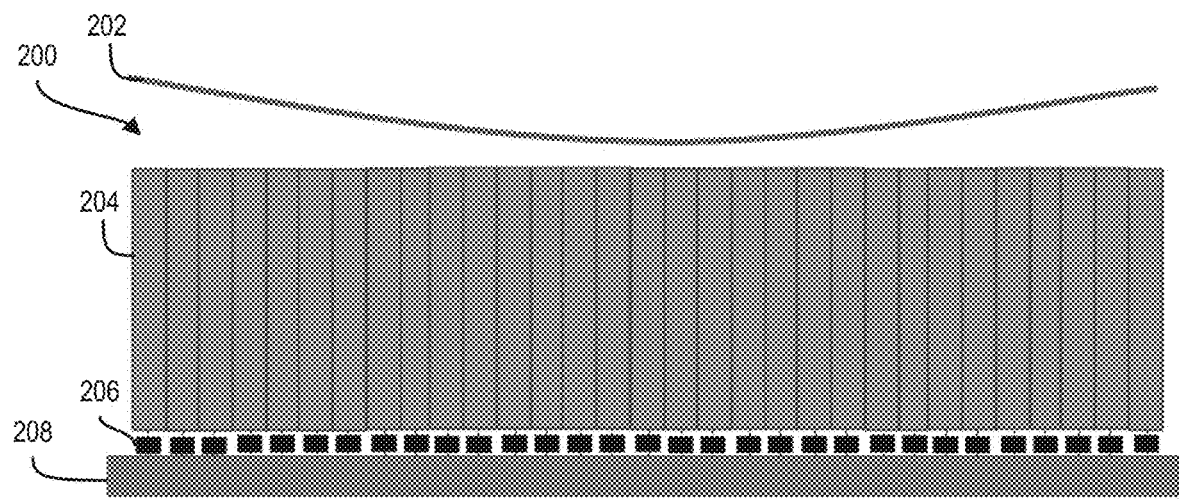
FIG. 2A illustrates a block diagram of an example pixelated chuck before being actuated to conform to a warped semiconductor wafer, in accordance with some embodiments of the present disclosure.

FIG. 2A illustrates a block diagram of an example pixelated chuck 200 before being actuated to conform to a warped semiconductor wafer 202, in accordance with some embodiments of the present disclosure. Pixelated chuck 200 can be consistent with pixelated chuck 106 of FIG. 1. Pixelated chuck 200 includes a plurality of sections 204 respectively attached to a plurality of actuators 206. The plurality of actuators 206 couple the plurality of sections 204 to a base plate 208.

The sections 204 are shown as rods with a circular, square, or rectangular cross-section, however, in other embodiments, the sections 204 are rods of a different geometry (e.g., cylinders, etc.), or a different geometry altogether (e.g., concentric cylinders, concentric parallelograms, etc.).

Each actuator 206 can raise or lower an associated section 204 to cause the pixelated chuck 200 to mirror a warpage of the warped semiconductor wafer 202. The actuators 206 can operate by electrical, pneumatic, hydraulic, magnetic, electromagnetic, and/or electromechanical force.

Warped semiconductor wafer 202 can be consistent with wafer 102 of FIG. 1. Warped semiconductor wafer 202 exhibits approximately symmetric warpage along one dimension, however, warped semiconductor wafer 202 is shown for illustrative purposes, and it should be understood that warped semiconductor wafer 202 can exhibit warpage in multiple dimensions, multiple warpage features within a same dimension, and/or asymmetric warpage.

Figure 2B:
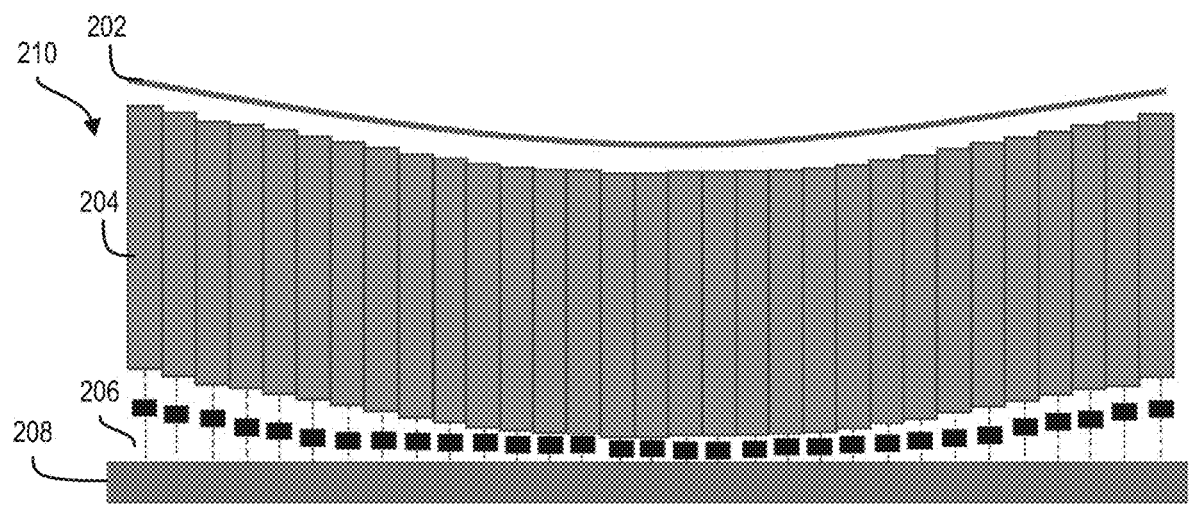
FIG. 2B illustrates a block diagram of an example pixelated chuck after being actuated to conform to a warped semiconductor wafer, in accordance with some embodiments of the present disclosure.

FIG. 2B illustrates a block diagram of an example pixelated chuck 210 after being actuated to conform to the warped semiconductor wafer 202, in accordance with some embodiments of the present disclosure. As shown in FIG. 2B, the actuators 206 are variously activated to cause associated sections 204 to rise by different amounts to mirror the warped semiconductor wafer 202. In this way, the pixelated chuck 210 can successfully retain the warped semiconductor wafer 202 for processing (e.g., using vacuum pressure and/or electrostatic forces) due to the increased contact surface area between the surface of the pixelated chuck 210 and the warped semiconductor wafer 202.

FIGS. 2A and 2B illustrate cross-sectional views of a surface of a pixelated chuck 200, 210 conforming to a warped semiconductor wafer 202. However, FIGS. 2A and 2B are shown for illustrative purposes alone, and they should not be construed as limiting. For example, the sections 204 can exhibit different sizes, spacings, and/or geometries. The actuators 206 can be smaller, larger, and/or grouped together. The sizes and/or dimensions of features shown in FIGS. 2A and 2B are not necessarily representative, nor are the relative sizes, dimensions, or relations between different features.

Figure 3A:
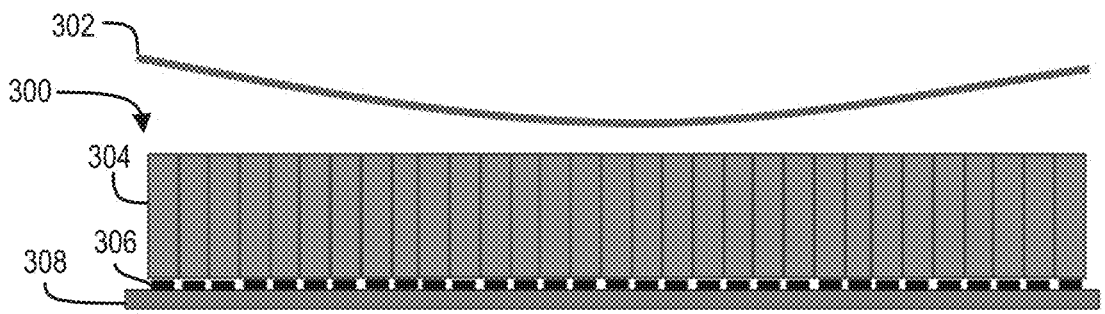
FIG. 3A illustrates a block diagram of an example pixelated chuck before being actuated to conform to a warped semiconductor wafer, in accordance with some embodiments of the present disclosure.
Figure 3B:
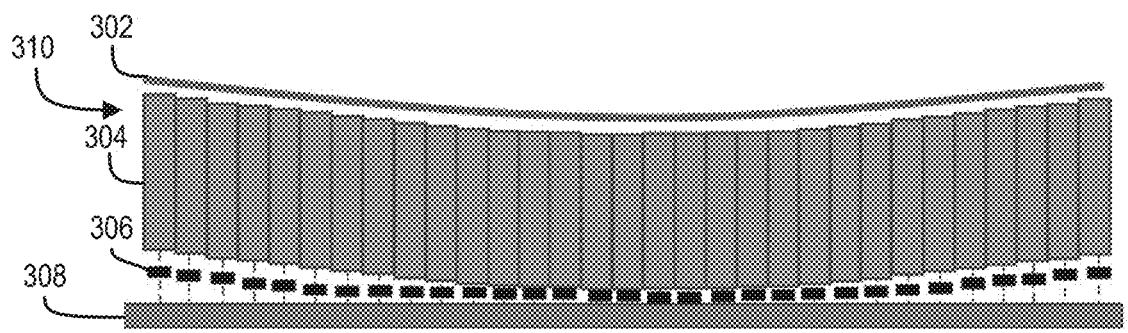
FIG. 3B illustrates a block diagram of an example pixelated chuck after a first actuation to conform to a warped semiconductor wafer, in accordance with some embodiments of the present disclosure.
Figure 3C:
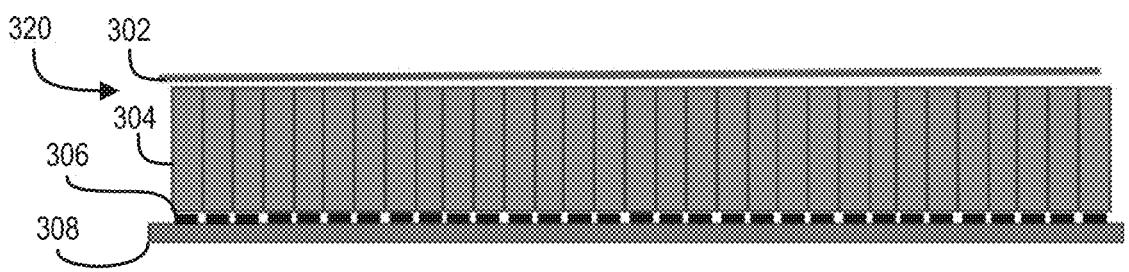
FIG. 3C illustrates a block diagram of an example pixelated chuck after a second actuation to flatten the warped semiconductor wafer, in accordance with some embodiments of the present disclosure.

FIG. 3A illustrates a block diagram of an example pixelated chuck 300 before being actuated to conform to a warped semiconductor wafer 302, in accordance with some embodiments of the present disclosure. FIGS. 3A, 3B, and 3C include sections 304, actuators 306, and base plate 308 which can be consistent with sections 204, actuators 206, and base plate 208 previously described with respect to FIGS. 2A and 2B.

FIG. 3B illustrates a block diagram of an example pixelated chuck 310 after a first actuation to conform to the warped semiconductor wafer 302, in accordance with some embodiments of the present disclosure. FIG. 3B is similar in nature to FIG. 2B, where the actuators 306 are respectively activated to cause the sections 304 to mirror a warpage of the warped semiconductor wafer 302, thereby enabling the pixelated chuck 310 to retain the warped semiconductor wafer 302 for processing due to the increased contact area between the pixelated chuck 310 and the warped semiconductor wafer 302.

FIG. 3C illustrates a block diagram of an example pixelated chuck 320 after a second actuation to reduce warpage (e.g., flatten) the warped semiconductor wafer 302, in accordance with some embodiments of the present disclosure. As shown in FIG. 3C, the actuators 306 are actuated a subsequent time (or repeatedly actuated in multiple, small increments) to cause the sections 304 to reduce warpage in the warped semiconductor wafer 302. In these embodiments, the pixelated chuck 320 can rely on the vacuum pressure and/or electrostatic forces retaining the warped semiconductor wafer 302 to the pixelated chuck 320 to be sufficient to overcome the internal stresses causing the warpage of the warped semiconductor wafer 302. In some embodiments, the nature of the processing being performed on the warped semiconductor wafer 302 while it is in the pixelated chuck 320 makes this reduction in warpage more manageable. For example, the processing can utilize an increased temperature, where the increased temperature can make the warped semiconductor wafer 302 more pliable and/or cause the different components of the warped semiconductor wafer 302 to expand according to their respective CTEs and, through the CTE expansion, reduce internal stresses causing the warpage. In some embodiments, the pixelated chuck 320 permanently flattens the warped semiconductor wafer 302 (e.g., by retaining the warped semiconductor wafer 302 in a flattened state during a temperature drop), whereas in other embodiments, the pixelated chuck 320 temporarily flattens the warped semiconductor wafer 302 to enable processing on the warped semiconductor wafer 302, and after the processing, the warped semiconductor wafer 302 is released from the pixelated chuck 320 and returns to a warped state (which can be similar or dissimilar to its initial warped state).

FIGS. 3A-3C illustrate cross-sectional views of a surface of pixelated chucks 300, 310, and 320 conforming to a warped semiconductor wafer 302. However, FIGS. 3A-3C are shown for illustrative purposes alone, and they should not be construed as limiting. For example, the sections 304 can exhibit different sizes, spacings, and/or geometries. The actuators 306 can be smaller, larger, and/or grouped together. The sizes and/or dimensions of features shown in FIGS. 3A-3C are not necessarily representative, nor are the relative sizes, dimensions, or relations between different features.

Figure 4A:
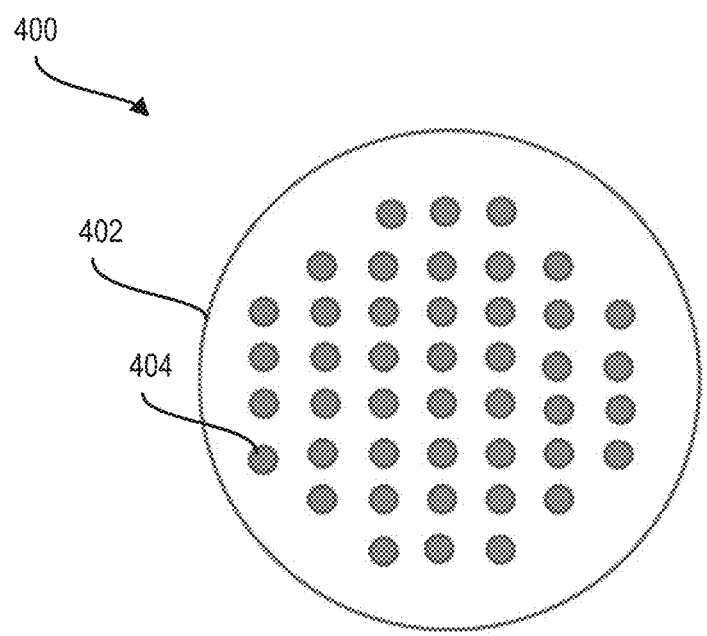
FIG. 4A illustrates a block diagram of a top view of an example pixelated chuck having a plurality of rods, in accordance with some embodiments of the present disclosure.

FIG. 4A illustrates a block diagram of a top view of an example pixelated chuck 400 having a plurality of rods 404, in accordance with some embodiments of the present disclosure. The pixelated chuck 400 can have the plurality of rods 404 affixed to a base plate 402. As shown in FIG. 4A, the base plate 402 is circular, however, any number of geometries are contemplated to match a type of wafer being processed. Rods 404 are shown with a circular cross section, however, rods 404 can also have square cross-sections, rectangular cross-sections, or any other cross-section. Furthermore, although rods 404 are shown with a solid cross-section, rods 404 can also have hollow cross-sections (e.g., cylinders). Advantageously, the rods 404 can be useful for replicating a range of warpages, whether symmetric or asymmetric.

Figure 4B:
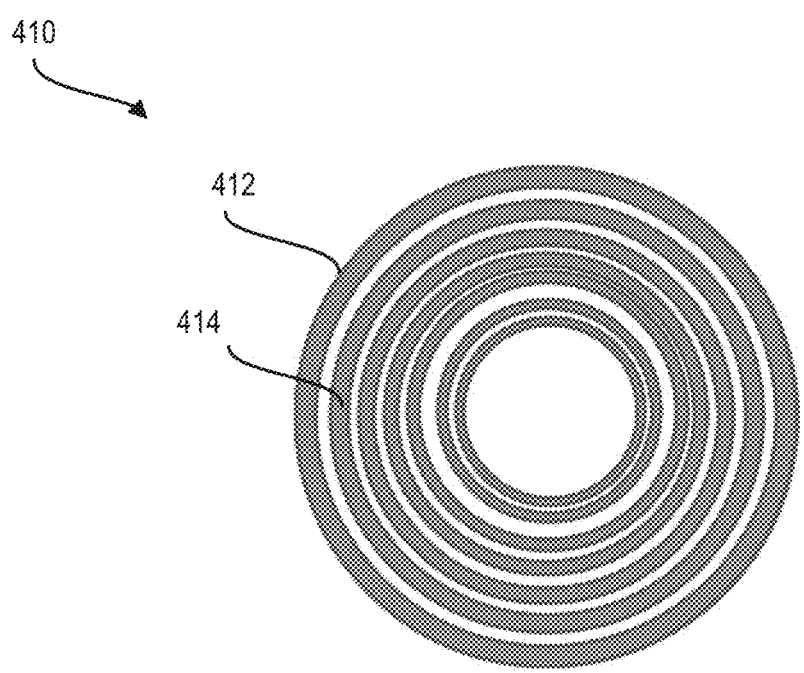
FIG. 4B illustrates a block diagram of a top view of another example pixelated chuck having a plurality of concentric geometries, in accordance with some embodiments of the present disclosure.

FIG. 4B illustrates a block diagram of a top view of another example pixelated chuck 410 having a plurality of concentric geometries 414, in accordance with some embodiments of the present disclosure. Similar to FIG. 4A, the pixelated chuck 410 of FIG. 4B includes a circular base plate 412. However, base plate 412 can be any geometry suitable for receiving and retaining a warped semiconductor wafer. Concentric geometries 414 are shown as concentric circles (i.e., cylinders), but in other embodiments, the concentric geometries 414 can be any other geometry such as rectangular, square, or another geometry suited to retaining a warped semiconductor wafer. In some embodiments, the pixelated chuck 410 with concentric geometries 414 is suited for retaining warped semiconductor wafers exhibiting approximately symmetric warpage, insofar as the concentric nature of the concentric geometries 414 restricts the pixelated chuck 410 to mirroring approximately symmetric warpage characteristics.

FIGS. 4A and 4B illustrate top views of a surface of pixelated chucks 400, 410. However, FIGS. 4A and 4B are shown for illustrative purposes alone, and they should not be construed as limiting. For example, the rods 404 and concentric geometries 414 can exhibit different sizes, spacings, and/or geometries. The sizes and/or dimensions of features shown in FIGS. 4A and 4B are not necessarily representative, nor are the relative sizes, dimensions, or relations between different features.

Figure 5:
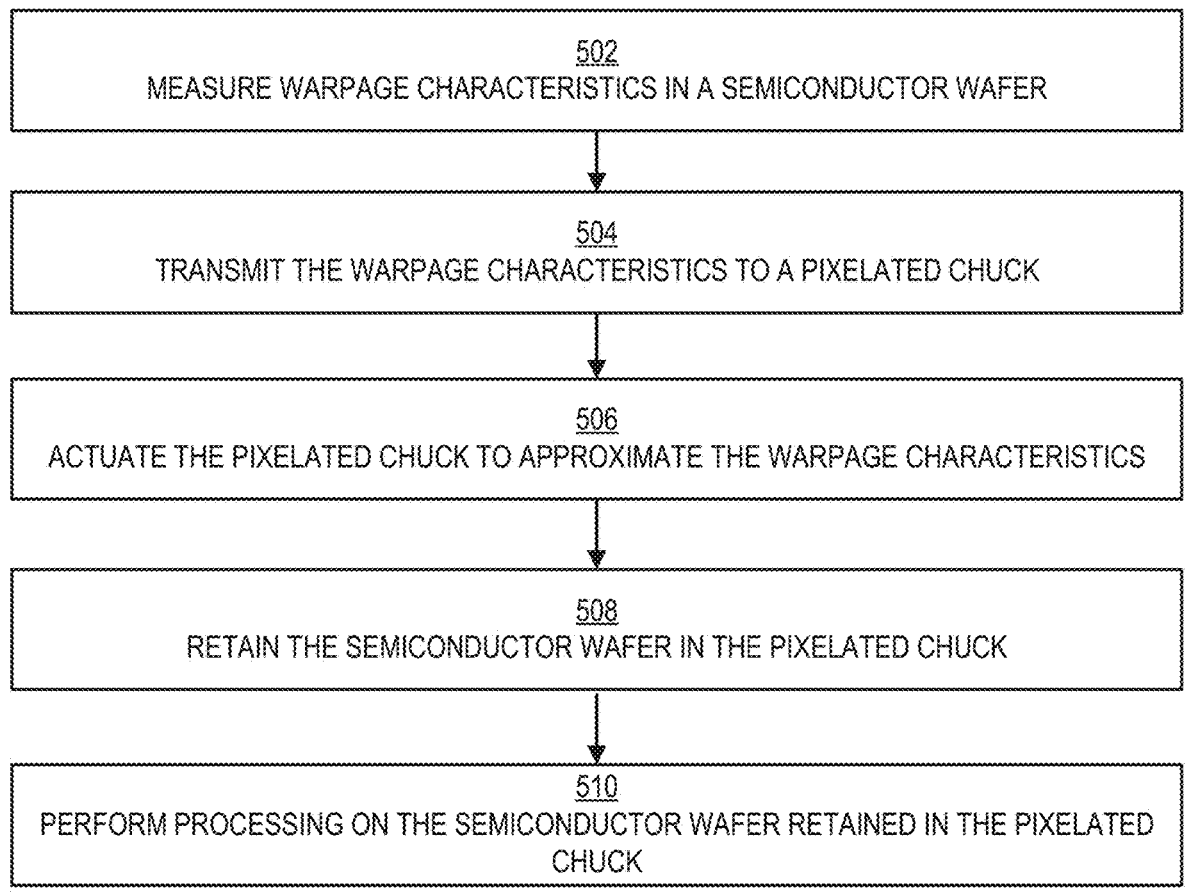
FIG. 5 illustrates a flowchart of an example method for utilizing a pixelated chuck to perform processing on a warped semiconductor wafer, in accordance with some embodiments of the present disclosure.

FIG. 5 illustrates a flowchart of an example method 500 for utilizing a pixelated chuck to perform processing on a semiconductor wafer, in accordance with some embodiments of the present disclosure. The method 500 can be implemented by a computer, processor, pixelated chuck (e.g., pixelated chuck 106 of FIG. 1), chuck actuation manager (e.g., chuck actuation manager 110 of FIG. 1), or any other configuration of hardware and/or software.

Operation 502 includes measuring warpage characteristics in a semiconductor wafer. Warpage characteristics can be measured by a warp measurement tool using laser measurements and/or image analysis.

Operation 504 includes transmitting the warpage characteristics to a pixelated chuck. In some embodiments, operation 504 includes storing the warpage characteristics in a computer-readable storage medium of the pixelated chuck. Operation 506 includes actuating the pixelated chuck to approximate the warpage characteristics. In some embodiments, operation 506 includes converting the warpage characteristics to a set of activations of a plurality of actuators to cause a plurality of sections of the pixelated chuck to approximate the warpage characteristics. In these embodiments, the conversion can be performed by executing computer program code in a computer-readable storage medium of the pixelated chuck.

Operation 508 includes retaining the semiconductor wafer in the pixelated chuck. Operation 508 can include using vacuum pressure and/or electrostatic forces to retain the semiconductor wafer in the pixelated chuck. As such, the pixelated chuck can create pressure differentials (e.g., vacuum), and/or voltage differentials (e.g., bias voltage) in or between respective sections of the pixelated chuck to retain the semiconductor wafer in the pixelated chuck.

Operation 510 includes performing processing on the semiconductor wafer retained in the pixelated chuck. Operation 510 can utilize any number of semiconductor fabrication tools, now known or later developed, to perform the processing. In some embodiments, heat is conducted through (or between) the sections of the pixelated chuck to heat the surface of the pixelated chuck to a predetermined temperature as part of the processing.

Figure 6A:
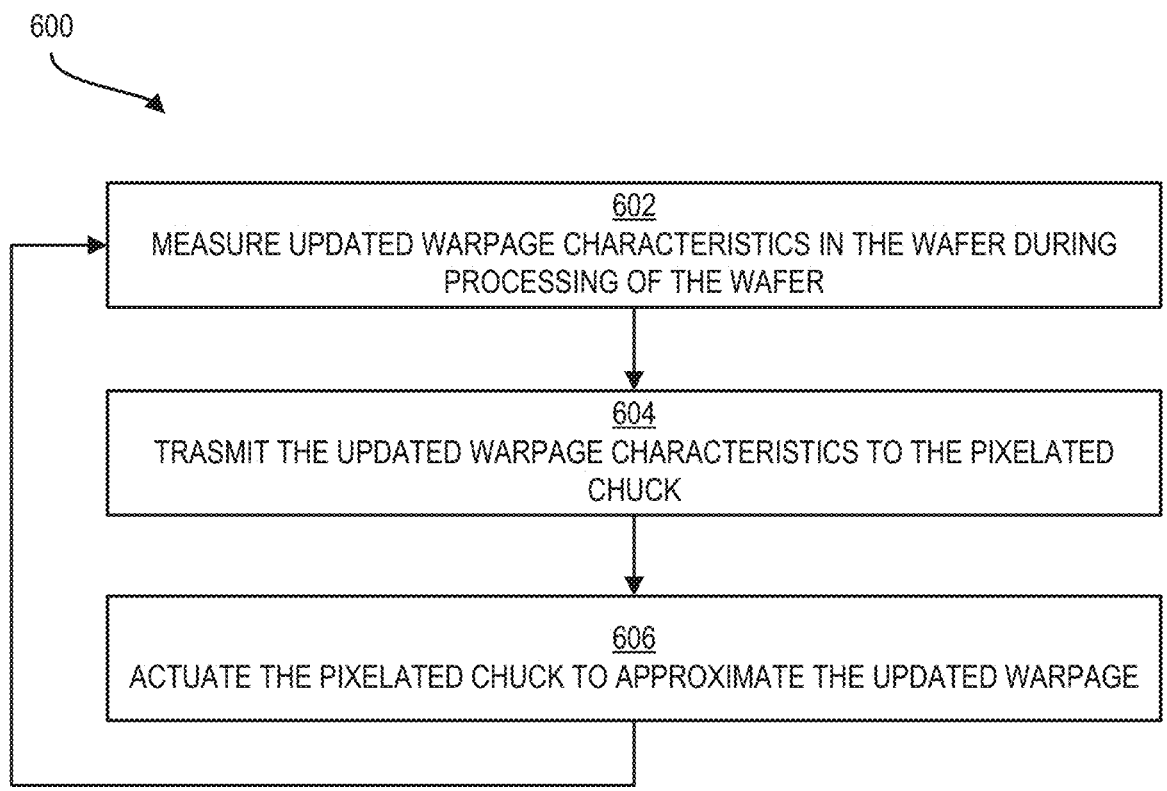
FIG. 6A illustrates a flowchart of an example method for modifying the pixelated chuck during semiconductor processing to conform to changing warpage in the warped semiconductor wafer, in accordance with some embodiments of the present disclosure.

FIG. 6A illustrates a flowchart of an example method for modifying the pixelated chuck during semiconductor processing to conform to changing warpage in the semiconductor wafer, in accordance with some embodiments of the present disclosure. The method 600 can be implemented by a computer, processor, pixelated chuck (e.g., pixelated chuck 106 of FIG. 1), chuck actuation manager (e.g., chuck actuation manager 110 of FIG. 1), or any other configuration of hardware and/or software. In some embodiments, the method 600 is a sub-method of operation 510 of FIG. 5. Accordingly, in such embodiments, performing processing on the semiconductor wafer includes modifying the pixelated chuck during the semiconductor processing.

Operation 602 includes measuring updated warpage characteristics in the wafer during processing of the wafer. As is understood by one skilled in the art, warpage of the wafer can change during processing as a result of, for example, changes in temperature that result from the processing, addition of material resulting from the processing, removal of material resulting from the processing, and/or other aspects of the processing. The updated warpage characteristics can be measured in a similar manner as previously discussed for measuring the original warpage characteristics (e.g., see operation 502 of FIG. 5).

Operation 604 includes transmitting the updated warpage characteristics to the pixelated chuck. In some embodiments, operation 604 includes storing the updated warpage characteristics in the computer-readable storage medium of the pixelated chuck and/or converting the updated warpage characteristics to one or more sets of activations of the actuators to cause the sections of the pixelated chuck to conform to the updated warpage characteristics.

Operation 606 includes actuating the sections of the pixelated chuck to approximate the updated warpage. The method 600 can then return to operation 602 to again measure a new set of warpage characteristics in the semiconductor wafer. In this way, the method 600 can successfully retain the warped semiconductor wafer throughout processing of the warped semiconductor wafer, even where that processing causes changes to the warpage of the warped semiconductor wafer.

Figure 6B:
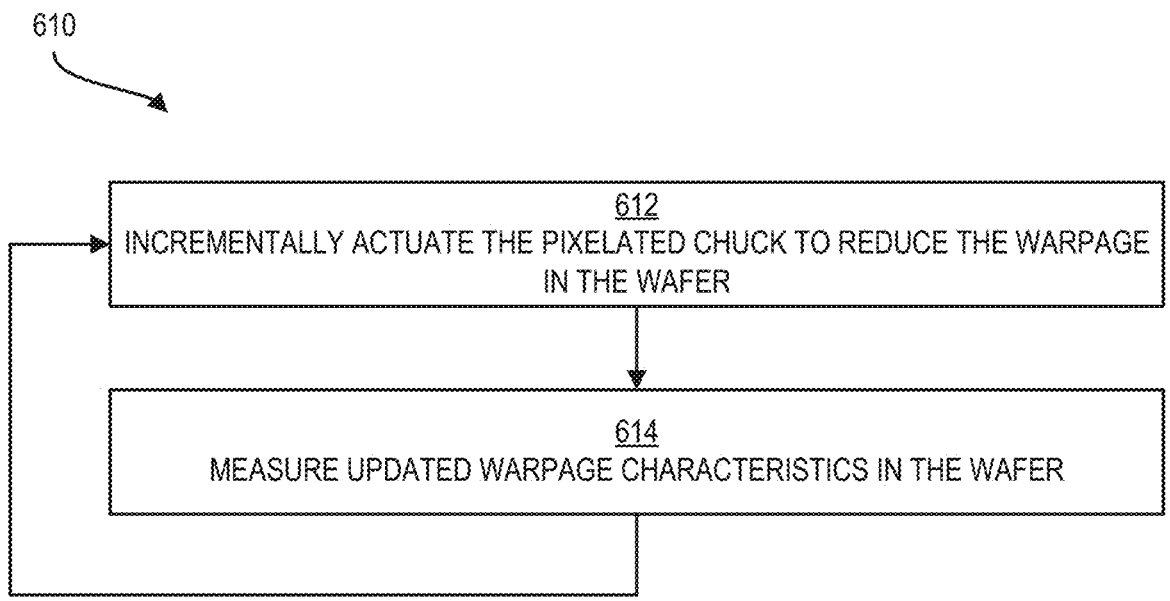
FIG. 6B illustrates a flowchart of an example method for incrementally modifying the pixelated chuck during semiconductor processing to reduce warpage in the warped semiconductor wafer, in accordance with some embodiments of the present disclosure.

FIG. 6B illustrates a flowchart of an example method for incrementally modifying the pixelated chuck during semiconductor processing to reduce warpage in the semiconductor wafer, in accordance with some embodiments of the present disclosure. The method 610 can be implemented by a computer, processor, pixelated chuck (e.g., pixelated chuck 106 of FIG. 1), chuck actuation manager (e.g., chuck actuation manager 110 of FIG. 1), or any other configuration of hardware and/or software. In some embodiments, the method 610 is a sub-method of operation 510 of FIG. 5. Accordingly, in such embodiments, performing processing on the semiconductor wafer includes incrementally modifying the pixelated chuck during the semiconductor processing.

Operation 612 includes incrementally actuating the pixelated chuck to reduce the warpage in the semiconductor wafer. In some embodiments, the incremental reduction in warpage can be predetermined reductions in height differences between adjacent sections of the pixelated chuck, starting with a section in a baseline (or "flat") position. In other embodiments, incremental reduction in warpage can be a percentage reduction in a warpage metric. In other embodiments, the incremental reduction in warpage can be defined by algorithms for reducing different degrees and types of warpage.

Operation 614 includes measuring updated warpage characteristics in the wafer. Operation 614 can thus include determining when the warped semiconductor wafer reaches a sufficiently flat threshold (e.g., warpage characteristics below a threshold). The method 610 can return to operation 612 to again incrementally actuate the pixelated chuck to reduce warpage in the wafer as many times as may be required until the warped semiconductor wafer exhibits sufficient flatness. In this way, the method 610 can reduce warpage in the semiconductor wafer, where such reduced warpage can improve processing on the semiconductor wafer. Further, method 610 improves outcomes of flattening wafers relative to mechanical flattening methods insofar as the method 610 exhibits increased surface contact between the pixelated chuck and the warped semiconductor wafer during the flattening process (as compared a warped semiconductor wafer being compressed onto a flat chuck).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 7:
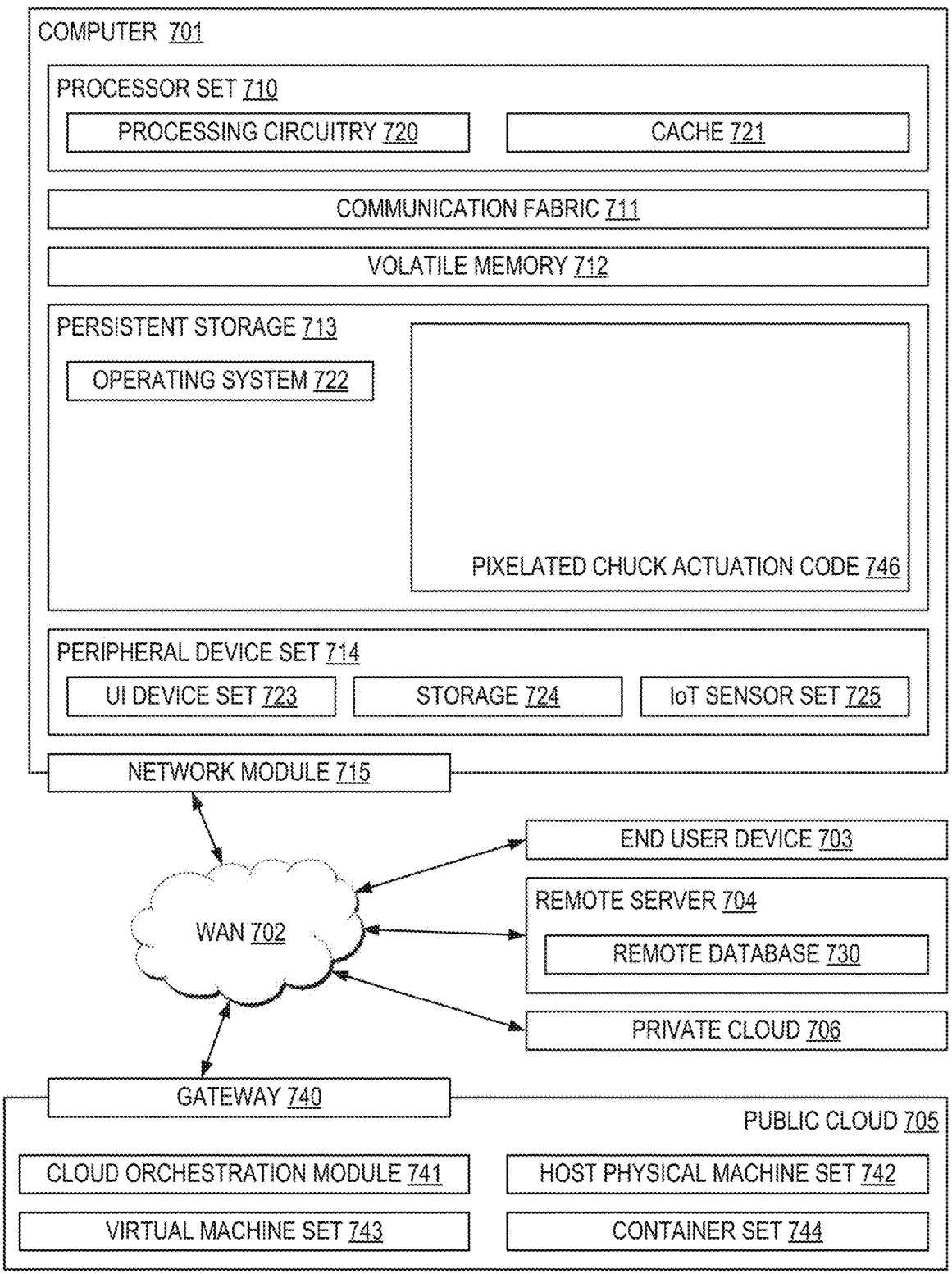
FIG. 7 illustrates a block diagram of an example computing environment, in accordance with some embodiments of the present disclosure.

FIG. 7 illustrates a block diagram of an example computing environment, in accordance with some embodiments of the present disclosure. Computing environment 700 contains an example of an environment for the execution of at least some of the computer code involved in performing the inventive methods, such as pixelated chuck actuation code 746. In addition to pixelated chuck actuation code 746, computing environment 700 includes, for example, computer 701, wide area network (WAN) 702, end user device (EUD) 703, remote server 704, public cloud 705, and private cloud 706. In this embodiment, computer 701 includes processor set 710 (including processing circuitry 720 and cache 721), communication fabric 711, volatile memory 712, persistent storage 713 (including operating system 722 and pixelated chuck actuation code 746, as identified above), peripheral device set 714 (including user interface (UI), device set 723, storage 724, and Internet of Things (IoT)

sensor set 725), and network module 715. Remote server 704 includes remote database 730. Public cloud 705 includes gateway 740, cloud orchestration module 741, host physical machine set 742, virtual machine set 743, and container set 744.

COMPUTER 701 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 730. As is well understood in the art of computer technology, and depending upon the technology, performance of a computer-implemented method may be distributed among multiple computers and/or between multiple locations. On the other hand, in this presentation of computing environment 700, detailed discussion is focused on a single computer, specifically computer 701, to keep the presentation as simple as possible. Computer 701 may be located in a cloud, even though it is not shown in a cloud in FIG. 7. On the other hand, computer 701 is not required to be in a cloud except to any extent as may be affirmatively indicated.

PROCESSOR SET 710 includes one, or more, computer processors of any type now known or to be developed in the future. Processing circuitry 720 may be distributed over multiple packages, for example, multiple, coordinated integrated circuit chips. Processing circuitry 720 may implement multiple processor threads and/or multiple processor cores. Cache 721 is memory that is located in the processor chip package(s) and is typically used for data or code that should be available for rapid access by the threads or cores running on processor set 710. Cache memories are typically organized into multiple levels depending upon relative proximity to the processing circuitry. Alternatively, some, or all, of the cache for the processor set may be located "off chip." In some computing environments, processor set 710 may be designed for working with qubits and performing quantum computing.

Computer readable program instructions are typically loaded onto computer 701 to cause a series of operational steps to be performed by processor set 710 of computer 701 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 721 and the other storage media discussed below. The program instructions, and associated data, are accessed by processor set 710 to control and direct performance of the inventive methods. In computing environment 700, at least some of the instructions for performing the inventive methods may be stored in pixelated chuck actuation code 746 in persistent storage 713.

COMMUNICATION FABRIC 711 is the signal conduction paths that allow the various components of computer 701 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 712 is any type of volatile memory now known or to be developed in the future. Examples include dynamic type random access memory (RAM) or static type RAM. Typically, the volatile memory is characterized by random access, but this is not required unless affirmatively indicated. In computer 701, the volatile memory 712 is located in a single package and is internal to computer 701, but, alternatively or additionally, the volatile memory may be distributed over multiple packages and/or located externally with respect to computer 701.

PERSISTENT STORAGE 713 is any form of non-volatile storage for computers that is now known or to be developed in the future. The non-volatility of this storage means that the stored data is maintained regardless of whether power is being supplied to computer 701 and/or directly to persistent storage 713. Persistent storage 713 may be a read only memory (ROM), but typically at least a portion of the persistent storage allows writing of data, deletion of data and re-writing of data. Some familiar forms of persistent storage include magnetic disks and solid state storage devices. Operating system 722 may take several forms, such as various known proprietary operating systems or open source Portable Operating System Interface type operating systems that employ a kernel. The code included in pixelated chuck actuation code 746 typically includes at least some of the computer code involved in performing the inventive methods.

PERIPHERAL DEVICE SET 714 includes the set of peripheral devices of computer 701. Data communication connections between the peripheral devices and the other components of computer 701 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 723 may include components such as a display screen, speaker, microphone, wearable devices (such as goggles and smart watches), keyboard, mouse, printer, touchpad, game controllers, and haptic devices. Storage 724 is external storage, such as an external hard drive, or insertable storage, such as an SD card. Storage 724 may be persistent and/or volatile. In some embodiments, storage 724 may take the form of a quantum computing storage device for storing data in the form of qubits. In embodiments where computer 701 is required to have a large amount of storage (for example, where computer 701 locally stores and manages a large database) then this storage may be provided by peripheral storage devices designed for storing very large amounts of data, such as a storage area network (SAN) that is shared by multiple, geographically distributed computers. IoT sensor set 725 is made up of sensors that can be used in Internet of Things applications. For example, one sensor may be a thermometer and another sensor may be a motion detector.

NETWORK MODULE 715 is the collection of computer software, hardware, and firmware that allows computer 701 to communicate with other computers through WAN 702. Network module 715 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 715 are performed on the same physical hardware device. In other embodiments (for example, embodiments that utilize software-defined networking (SDN)), the control functions and the forwarding functions of network module 715 are performed on physically separate devices, such that the control functions manage several different network hardware devices. Computer readable program instructions for performing the inventive methods can typically be downloaded to computer 701 from an external computer or external storage device through a network adapter card or network interface included in network module 715.

WAN 702 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 703 is any computer system that is used and controlled by an end user (for example, a customer of an enterprise that operates computer 701), and may take any of the forms discussed above in connection with computer 701. EUD 703 typically receives helpful and useful data from the operations of computer 701. For example, in a hypothetical case where computer 701 is designed to provide a recommendation to an end user, this recommendation would typically be communicated from network module 715 of computer 701 through WAN 702 to EUD 703. In this way, EUD 703 can display, or otherwise present, the recommendation to an end user. In some embodiments, EUD 703 may be a client device, such as thin client, heavy client, mainframe computer, desktop computer and so on.

REMOTE SERVER 704 is any computer system that serves at least some data and/or functionality to computer 701. Remote server 704 may be controlled and used by the same entity that operates computer 701. Remote server 704 represents the machine(s) that collect and store helpful and useful data for use by other computers, such as computer 701. For example, in a hypothetical case where computer 701 is designed and programmed to provide a recommendation based on historical data, then this historical data may be provided to computer 701 from remote database 730 of remote server 704.

PUBLIC CLOUD 705 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 705 is performed by the computer hardware and/or software of cloud orchestration module 741. The computing resources provided by public cloud 705 are typically implemented by virtual computing environments that run on various computers making up the computers of host physical machine set 742, which is the universe of physical computers in and/or available to public cloud 705. The virtual computing environments (VCEs) typically take the form of virtual machines from virtual machine set 743 and/or containers from container set 744. It is understood that these VCEs may be stored as images and may be transferred among and between the various physical machine hosts, either as images or after instantiation of the VCE. Cloud orchestration module 741 manages the transfer and storage of images, deploys new instantiations of VCEs and manages active instantiations of VCE deployments. Gateway 740 is the collection of computer software, hardware, and firmware that allows public cloud 705 to communicate through WAN 702.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 706 is similar to public cloud 705, except that the computing resources are only available for use by a single enterprise. While private cloud 706 is depicted as being in communication with WAN 702, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 705 and private cloud 706 are both part of a larger hybrid cloud.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or subset of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While it is understood that the process software (e.g., any software configured to perform any portion of the methods described previously and/or implement any of the functionalities described previously) can be deployed by manually loading it directly in the client, server, and proxy computers via loading a storage medium such as a CD, DVD, etc., the process software can also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by executing a set of program instructions that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then it will be stored on the proxy server.

Embodiments of the present invention can also be delivered as part of a service engagement with a client corporation, nonprofit organization, government entity, internal organizational structure, or the like. These embodiments can include configuring a computer system to perform, and deploying software, hardware, and web services that implement, some or all of the methods described herein. These embodiments can also include analyzing the client's operations, creating recommendations responsive to the analysis, building systems that implement subsets of the recommendations, integrating the systems into existing processes and infrastructure, metering use of the systems, allocating expenses to users of the systems, and billing, invoicing (e.g., generating an invoice), or otherwise receiving payment for use of the systems.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments can be practiced. These embodiments were described in sufficient detail to enable those skilled in the art to practice the embodiments, but other embodiments can be used and logical, mechanical, electrical, and other changes can be made without departing from the scope of the various embodiments. In the previous description, numerous specific details were set forth to provide a thorough understanding the various embodiments. But the various embodiments can be practiced without these specific details. In other instances, well-known circuits, structures, and techniques have not been shown in detail in order not to obscure embodiments.

Different instances of the word "embodiment" as used within this specification do not necessarily refer to the same embodiment, but they can. Any data and data structures illustrated or described herein are examples only, and in other embodiments, different amounts of data, types of data, fields, numbers and types of fields, field names, numbers and types of rows, records, entries, or organizations of data can be used. In addition, any data can be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

Any advantages discussed in the present disclosure are example advantages, and embodiments of the present disclosure can exist that realize all, some, or none of any of the discussed advantages while remaining within the spirit and scope of the present disclosure.

A non-limiting list of examples are provided hereinafter to demonstrate some aspects of the present disclosure. Example 1 is a pixelated chuck. The pixelated chuck comprises a plurality of sections forming a surface for retaining a semiconductor wafer; a plurality of actuators respectively associated with the plurality of sections; and a computer-readable storage medium storing warpage characteristics associated with the semiconductor wafer and executable instructions for transforming the warpage characteristics into a set of activations of the plurality of actuators to cause the plurality of sections to adjust the surface to conform to the semiconductor wafer.

Example 2 includes the features of Example 1. In this example, each section of the plurality of sections is independently movable.

Example 3 includes the features of any one of Examples 1 to 2. In this example, the plurality of actuators cause the associated sections to independently move.

Example 4 includes the features of any one of Examples 1 to 3. In this example, the plurality of sections comprises a plurality of rods.

Example 5 includes the features of any one of Examples 1 to 3. In this example, the plurality of sections comprises a plurality of concentric geometries.

Example 6 includes the features of any one of Examples 1 to 5. In this example, the plurality of sections is configured to draw a vacuum to retain the semiconductor wafer on the surface.

Example 7 includes the features of any one of Examples 1 to 5. In this example, the plurality of sections is configured to generate a bias voltage to electrostatically retain the semiconductor wafer on the surface.

Example 8 includes the features of any one of Examples 1 to 7. In this example, the plurality of sections is configured to conduct heat to cause the surface to have a predetermined temperature.

Example 9 includes the features of any one of Examples 1 to 8. In this example, the computer-readable storage medium further comprises executable instructions for a sequence of activations for the plurality of actuators to cause the plurality of sections to incrementally reduce warp in the surface.

Example 10 is a semiconductor processing system. The semiconductor processing system comprises a measurement tool configured to measure warpage characteristics in a semiconductor wafer; a pixelated surface configured to retain the semiconductor wafer, wherein the pixelated surface approximates the warpage characteristics to conform to the semiconductor wafer; and a semiconductor processing tool configured to perform processing on the semiconductor wafer while it is retained on the pixelated surface.

Example 11 includes the features of Example 10. In this example, the pixelated surface comprises: a plurality of sections for retaining the semiconductor wafer; a plurality of actuators respectively associated with the plurality of sections.

Example 12 includes the features of Example 11. In this example, respective sections of the plurality of sections are independently movable using the plurality of actuators.

Example 13 includes the features of any one of Examples 10 to 12. In this example, the pixelated surface retains the semiconductor wafer using electrostatic forces.

Example 14 includes the features of any one of Examples 10 to 12. In this example, the pixelated surface retains the semiconductor wafer using a vacuum.

Example 15 includes the features of any one of Examples 10 to 14. In this example, the measurement tool is configured to measure updated warpage characteristics in the semiconductor wafer during processing of the semiconductor wafer; and wherein the pixelated surface is configured to approximate the updated warpage characteristics during the processing of the semiconductor wafer.

Example 16 is a computer-implemented method. The computer-implemented method comprises measuring warpage characteristics of a semiconductor wafer; transmitting the warpage characteristics to a pixelated chuck; actuating the pixelated chuck to approximate the warpage characteristics; retaining the semiconductor wafer in the pixelated chuck; and performing processing on the semiconductor wafer retained in the pixelated chuck.

Example 17 includes the features of example 16. In this example, the method further comprises measuring updated warpage characteristics in the semiconductor wafer during processing of the semiconductor wafer; transmitting the updated warpage characteristics to the pixelated chuck; and actuating the pixelated chuck to approximate the updated warpage characteristics.

Example 18 includes the features of any one of Examples 16 to 17. In this example, the method further comprises incrementally actuating the pixelated chuck to reduce warpage in the semiconductor wafer; and measuring updated warpage characteristics in the semiconductor wafer after respective incremental actuations of the pixelated chuck.

Example 19 includes the features of any one of Examples 16 to 18. In this example, the pixelated chuck comprises: a plurality of sections forming a surface for retaining the semiconductor wafer; and a plurality of actuators respectively associated with the plurality of sections.

Example 20 includes the features of any one of Examples 16 to 19. In this example, the plurality of sections is selected from a group consisting of: a plurality of rods, and a plurality of concentric geometries; and wherein the pixelated chuck retains the semiconductor wafer using one selected from a group consisting of: electrostatic forces, and a vacuum.

Example 21 is a system. The system includes one or more computer readable storage media storing program instructions; and one or more processors which, in response to executing the program instructions, are configured to perform a method according to any one of Examples 16 to 20, including or excluding optional features.

Example 22 is a computer program product. The computer program product includes one or more computer readable storage media, and program instructions collectively stored on the one or more computer readable storage media, the program instructions comprising instructions configured to cause one or more processors to perform a method according to any one of Examples 16 to 20, including or excluding optional features.

What is claimed is:

1. A pixelated chuck comprising:
   a plurality of sections forming a surface for retaining a semiconductor wafer;
   a plurality of actuators respectively associated with the plurality of sections; and
   a computer-readable storage medium storing warpage characteristics associated with the semiconductor wafer and executable instructions for transforming the warpage characteristics into a set of activations of the plurality of actuators to cause the plurality of sections to adjust the surface to conform to the semiconductor wafer.

2. The pixelated chuck of claim 1, wherein each section of the plurality of sections is independently movable.

3. The pixelated chuck of claim 1, wherein the plurality of actuators cause the associated sections to independently move.

4. The pixelated chuck of claim 1, wherein the plurality of sections comprises a plurality of rods.

5. The pixelated chuck of claim 1, wherein the plurality of sections comprises a plurality of concentric geometries.

6. The pixelated chuck of claim 1, wherein the plurality of sections is configured to draw a vacuum to retain the semiconductor wafer on the surface.

7. The pixelated chuck of claim 1, wherein the plurality of sections is configured to generate a bias voltage to electrostatically retain the semiconductor wafer on the surface.

8. The pixelated chuck of claim 1, wherein the plurality of sections is configured to conduct heat to cause the surface to have a predetermined temperature.

9. The pixelated chuck of claim 1, wherein the computer-readable storage medium further comprises executable instructions for a sequence of activations for the plurality of actuators to cause the plurality of sections to incrementally reduce warp in the surface.

10. A semiconductor processing system comprising:
    a measurement tool configured to measure warpage characteristics in a semiconductor wafer;
    a pixelated surface configured to retain the semiconductor wafer, wherein the pixelated surface approximates the warpage characteristics to conform to the semiconductor wafer, wherein the pixelated surface comprises:
      a plurality of sections for retaining the semiconductor wafer; and
      a plurality of actuators respectively associated with the plurality of sections; and
    a semiconductor processing tool configured to perform processing on the semiconductor wafer while it is retained on the pixelated surface.

11. The semiconductor processing system of claim 10, wherein respective sections of the plurality of sections are independently movable using the plurality of actuators.

12. The semiconductor processing system of claim 10, wherein the pixelated surface retains the semiconductor wafer using electrostatic forces.

13. The semiconductor processing system of claim 10, wherein the pixelated surface retains the semiconductor wafer using a vacuum.

14. The semiconductor processing system of claim 10, wherein the measurement tool is configured to measure updated warpage characteristics in the semiconductor wafer during processing of the semiconductor wafer; and
wherein the pixelated surface is configured to approximate the updated warpage characteristics during the processing of the semiconductor wafer.

15. A computer-implemented method comprising:
measuring warpage characteristics of a semiconductor wafer;
transmitting the warpage characteristics to a pixelated chuck;
actuating the pixelated chuck to approximate the warpage characteristics;
retaining the semiconductor wafer in the pixelated chuck; and
performing processing on the semiconductor wafer retained in the pixelated chuck.

16. The method of claim 15, further comprising:
measuring updated warpage characteristics in the semiconductor wafer during processing of the semiconductor wafer;
transmitting the updated warpage characteristics to the pixelated chuck; and
actuating the pixelated chuck to approximate the updated warpage characteristics.

17. The method of claim 15, further comprising:
incrementally actuating the pixelated chuck to reduce warpage in the semiconductor wafer; and
measuring updated warpage characteristics in the semiconductor wafer after respective incremental actuations of the pixelated chuck.

18. The method of claim 15, wherein the pixelated chuck comprises:
a plurality of sections forming a surface for retaining the semiconductor wafer; and
a plurality of actuators respectively associated with the plurality of sections.

19. The method of claim 18, wherein the plurality of sections is selected from a group consisting of: a plurality of rods, and a plurality of concentric geometries; and
wherein the pixelated chuck retains the semiconductor wafer using one selected from a group consisting of: electrostatic forces, and a vacuum.

* * * * *